US012708020B2

(12) United States Patent
Yu et al.

(10) Patent No.: US 12,708,020 B2
(45) Date of Patent: Aug. 11, 2026

(54) CHIP PACKAGE HAVING A GLASS FIBER SUBSTRATE

(71) Applicant: WALTON ADVANCED ENGINEERING, INC., Kaohsiung (TW)

(72) Inventors: Hong-Chi Yu, Kaohsiung (TW); Chun-Jung Lin, Kaohsiung (TW); Ruei-Ting Gu, Kaohsiung (TW)

(73) Assignee: WALTON ADVANCED ENGINEERING, INC., Kaohsiung (TW)

( * ) Notice: Subject to any disclaimer, the term of this patent is extended or adjusted under 35 U.S.C. 154(b) by 378 days.

(21) Appl. No.: 18/243,670

(22) Filed: Sep. 8, 2023

(65) Prior Publication Data

US 2024/0120300 A1 Apr. 11, 2024

(30) Foreign Application Priority Data

Oct. 5, 2022 (TW) ................................. 111137875

(51) Int. Cl.

*H10W 72/90* (2026.01)
*H10W 72/00* (2026.01)
*H10W 72/50* (2026.01)
*H10W 90/00* (2026.01)

(52) U.S. Cl.

CPC ......... *H10W 72/90* (2026.01); *H10W 72/019* (2026.01); *H10W 72/50* (2026.01); *H10W 72/01935* (2026.01); *H10W 72/07554* (2026.01); *H10W 72/536* (2026.01);

(Continued)

(58) Field of Classification Search

CPC ......... H01L 24/05; H01L 24/03; H01L 24/48; H01L 24/45; H01L 24/04; H01L 2224/03462; H01L 2224/03464; H01L 2224/05083; H01L 2224/05155; H01L 2224/48105; H01L 2224/48229; H01L 2224/48453; H01L 2224/04042; H01L 2224/0508; H01L 2224/05144; H01L 2224/05164; H01L 2224/48091; H01L 2224/48247; H01L 2224/4845; H01L 2924/09511; H01L 2924/2064;

(Continued)

(56) References Cited

U.S. PATENT DOCUMENTS 6,094,058 A * 7/2000 Hembree .............. H10W 70/65 257/E23.07
2006/0012967 A1* 1/2006 Asai ......................... G02B 6/43 361/764

(Continued)

*Primary Examiner* — Wael M Fahmy
*Assistant Examiner* — Tiberiu Dan Onuta
(74) *Attorney, Agent, or Firm* — Fei-hung Yang

(57) ABSTRACT

A chip package which includes a glass fiber substrate made of FR-4 fiberglass is provided. The chip package further includes a substrate pad which is a stacked metal structure with a certain thickness and composed of a nickel layer, a palladium layer, and a gold layer, or a nickel layer and a gold layer stacked over at least one first circuit layer in turn. A total thickness of the substrate pad is 3.15-5.4 μm. The glass fiber substrate and the substrate pad can bear positive pressure generated during wire bonding. Thereby at least one solder joint is formed on the substrate pad precisely and integrally. This helps reduction in material cost for manufacturers.

5 Claims, 5 Drawing Sheets

(52) U.S. Cl.
CPC ........ *H10W 72/923* (2026.01); *H10W 72/952* (2026.01); *H10W 90/754* (2026.01)

(58) Field of Classification Search
CPC ... H01L 23/15; H01L 23/291; H01L 23/3114; H01L 23/482; H01L 23/49811
See application file for complete search history.

(56) References Cited

U.S. PATENT DOCUMENTS

| | | | | |
|---|---|---|---|---|
| 2008/0081457 | A1* | 4/2008 | Lin | H10W 20/043 257/E21.508 |
| 2009/0294962 | A1* | 12/2009 | Hsu | H05K 3/243 257/772 |
| 2021/0118824 | A1* | 4/2021 | Yoo | H10W 42/60 |
| 2023/0192980 | A1* | 6/2023 | Lee | C08J 5/18 257/40 |
| 2023/0420352 | A1* | 12/2023 | Ko | H10W 74/014 |

* cited by examiner

CHIP PACKAGE HAVING A GLASS FIBER SUBSTRATE

CROSS-REFERENCE TO RELATED APPLICATIONS

This non-provisional application claims priority under 35 U.S.C. § 119(a) on Patent Application No(s). 111137875 filed in Taiwan, R.O.C. on Oct. 5, 2022, the entire contents of which are hereby incorporated by reference.

BACKGROUND OF THE INVENTION

The present invention relates to a chip package, especially to a chip package in which a substrate is made of FR-4 fiberglass and a substrate is a stacked metal structure with a certain thickness formed by a nickel (Ni) layer, a palladium (Pd) layer, and a gold (Au) layer stacked over one another, or by a Ni layer and an Au layer stacked over each other.

In the chip package available now such as ball grid array (BGA), land grid array (LGA), Quad Flat No lead package (QFN), or dual flat no-lead (DFN), a substrate used is generally made of bismaleimide triazine (BT) resin. BT resin is a kind of hard material and a substrate made of BT resin can meet requirements for the chip package. However, cost of BT resin is higher so that material cost of manufacturing is increased. Thus there is a need to find a material for the substrate instead of BT resin in order to reduce the material cost of manufacturing.

Refer to FIG. 5, a chip package 2 available now includes a substrate 2*a* made of BT resin and a circuit layer 2*b* arranged over the substrate 2*a*. A solder pad 2*c* is disposed over the circuit layer 2*b* and made of a gold (Au) layer with a thickness of 0.3-0.4 μm. Thus the substrate 2*a* and the solder pad 2*c* can bear positive pressure generated during wire bonding process. Thereby a solder joint 2*e* of a bonding wire 2*d* can be formed on the solder pad 2*c* integrally and precisely. However, the amount of gold used affects material cost in manufacturing. In order to reduce the material cost, manufacturers need to find out a novel design with less amount of gold used.

SUMMARY OF THE INVENTION

Therefore, it is a primary object of the present invention to provide a chip package which includes a substrate made of FR-4 fiberglass and a substrate pad composed of a nickel (Ni) layer, a palladium (Pd) layer, and a gold (Au) layer stacked over one another, or a Ni layer and an Au layer stacked over each other. The substrate pad is a stacked metal structure with a total thickness ranging from 3.15 to 5.4 μm. The glass fiber substrate and the substrate pad can withstand positive pressure generated during wire bonding. Thereby the problem of higher material cost for manufacturers can be solved effectively.

In order to achieve the above objects, a chip package according to the present invention includes a glass fiber substrate, at least one chip, at least one substrate pad, at least one bonding wire, and a glass fiber insulating layer. The glass fiber substrate is made of FR-4 fiberglass and composed of a first surface and a second surface opposite to the first surface. At least one first circuit layer is disposed on the first surface of the glass fiber substrate. The chip which is provided with at least one chip pad is disposed on the first circuit layer on the first surface of the glass fiber substrate. The substrate pad which is arranged at the first circuit layer on the first surface of the glass fiber substrate is a stacked metal structure with a certain thickness and composed of a nickel (Ni) layer, a palladium (Pd) layer, and a gold (Au) layer stacked over the first circuit layer in turn. Or the substrate pad is a stacked metal structure composed of a Ni layer and an Au layer stacked over the first circuit layer in turn. A total thickness of the substrate pad is 3.15-5.4 μm for increasing structural strength of the substrate pad. The bonding wire is generated by wire bonding and provided with two ends respectively being welded to the chip pad of the chip and the substrate pad corresponding to the chip pad to form a solder joint on the chip pad and a solder joint on the substrate pad correspondingly. The glass fiber insulating layer made of FR-4 fiberglass is disposed on the glass fiber substrate by injection molding for covering and sealing the chip, the substrate pads, and the bonding wires. The chip and the first circuit layer on the first surface of the glass fiber substrate are electrically connected with each other by the bonding wire. Thereby the glass fiber substrate and the respective substrate pads can withstand positive pressure generated during wire bonding when the respective solder joints are formed on the respective substrate pads correspondingly. Thus the solder joints are formed on the substrate pads precisely and integrally.

Preferably, the substrate pad is formed by the Ni layer, the Pd layer, and the Au layer stacked over one another. In 3.15-5.4 μm of the total thickness of the substrate pad, a thickness of the Ni layer, a thickness of the Pd layer, and a thickness of the Au layer are respectively 3-5 μm, 0.1-0.2 μm, and 0.05-0.2 μm.

Preferably, the substrate pad is formed by the Ni layer and the Au layer stacked over each other. In 3.15-5.4 μm of the total thickness of the substrate pad, a thickness of the Ni layer is 3.1-5.2 μm and a thickness of the Au layer is 0.05-0.2 μm.

DETAILED DESCRIPTION OF THE PREFERRED EMBODIMENT

Figure 1:
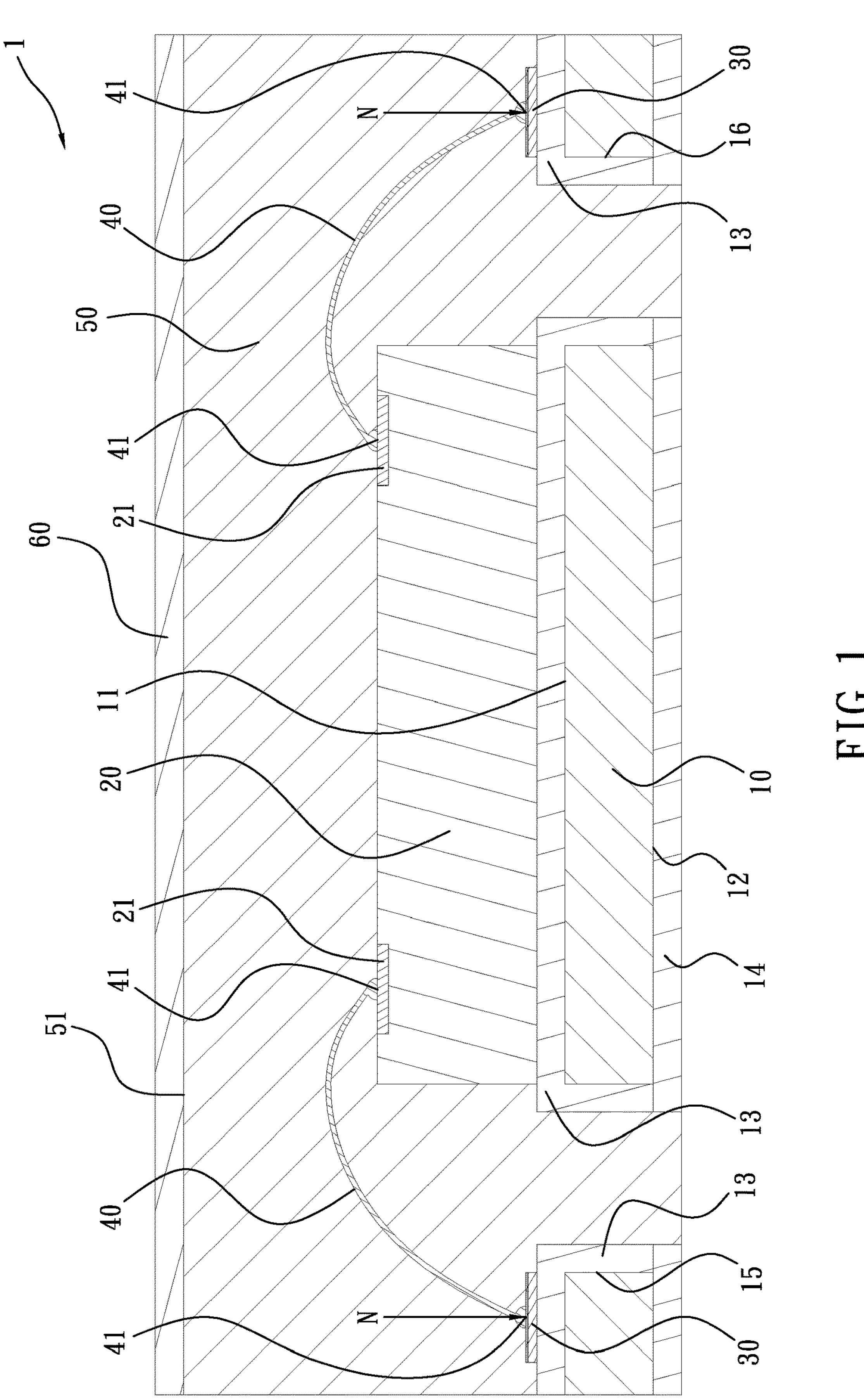
FIG. 1 is a side view of a section of an embodiment of a chip package according to the present invention.
Figure 3:
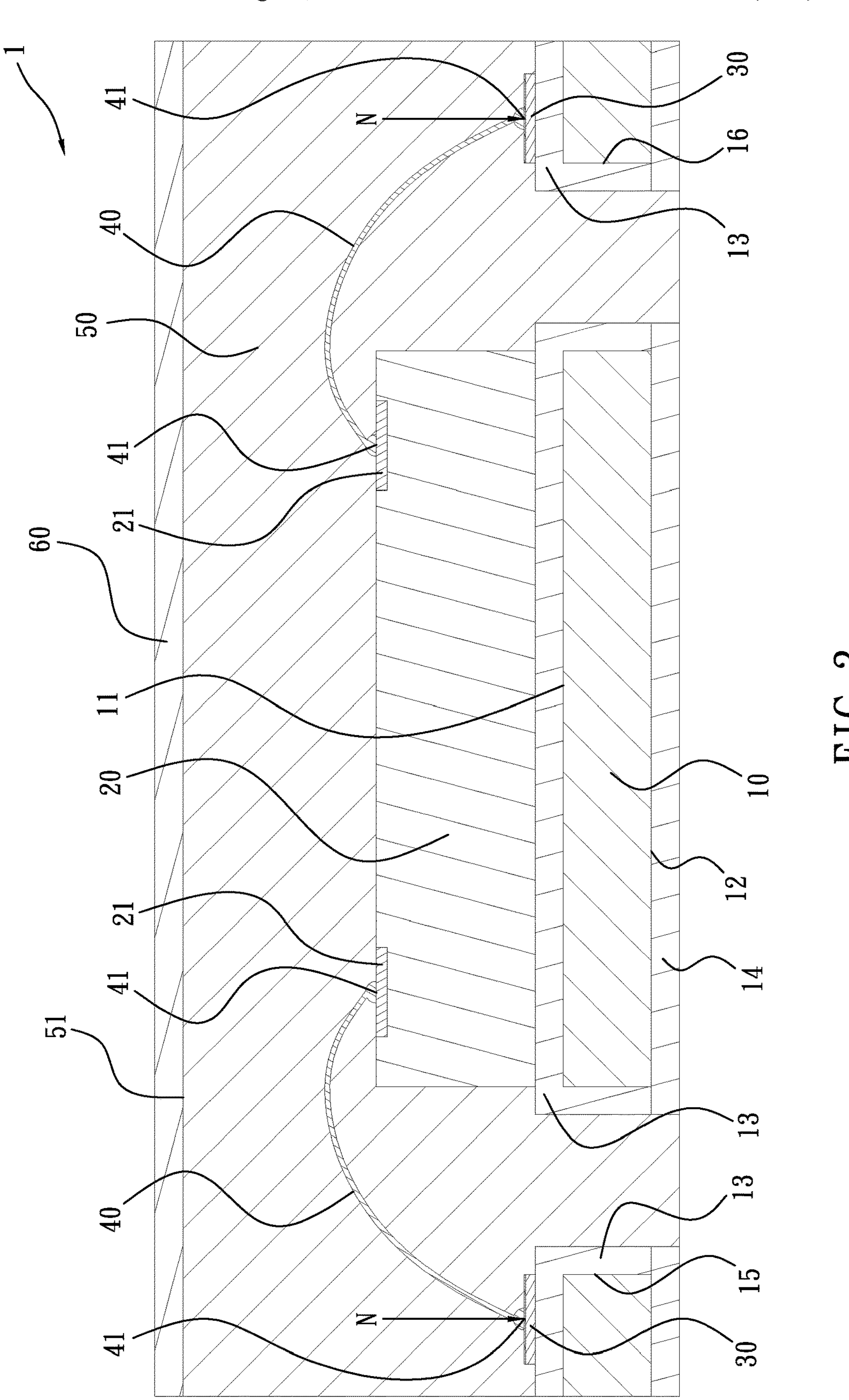
FIG. 3 is a side view of a section of another embodiment of a chip package according to the present invention.

Refer to FIG. 1 and FIG. 3, a chip package 1 according to the present invention includes a glass fiber substrate 10, at least one chip 20, at least one substrate pad 30, at least one bonding wire 40, and a glass fiber insulating layer 50.

The glass fiber substrate 10 is made of FR-4 fiberglass and composed of a first surface 11 and a second surface 12 opposite to the first surface 11. At least one first circuit layer 13 is disposed on the first surface 11 and at least one second circuit layer 14 is arranged at the second surface 12 (but not limited). At least one first blind hole 15 and at least one second blind hole 16 are formed on the first surface 11 of the glass fiber substrate 10 by drilling and both penetrating the first surface 11 and the glass fiber substrate 10 to be communicating with the second circuit layer 14. The first circuit layer 13 is extending from the first surface 11 and through an inner surface of both the first blind hole 15 and the second blind hole 16 to be electrically connected with the second circuit layer 14.

FR-4 refers to a grade of a flame retardant material which has better mechanical properties, dielectric performance, thermal resistance, moisture resistance, and easy machining. Generally, the FR-4 material is composed of woven glass and epoxy resin. Compared with the substrate made of Bismaleimide Triazine (BT) resin available now, the glass fiber substrate 10 made of FR-4 is softer.

The chip 20 which is provided with at least one chip pad 21 is disposed on the first circuit layer 13 on the first surface 11 of the glass fiber substrate 10.

Figure 2:
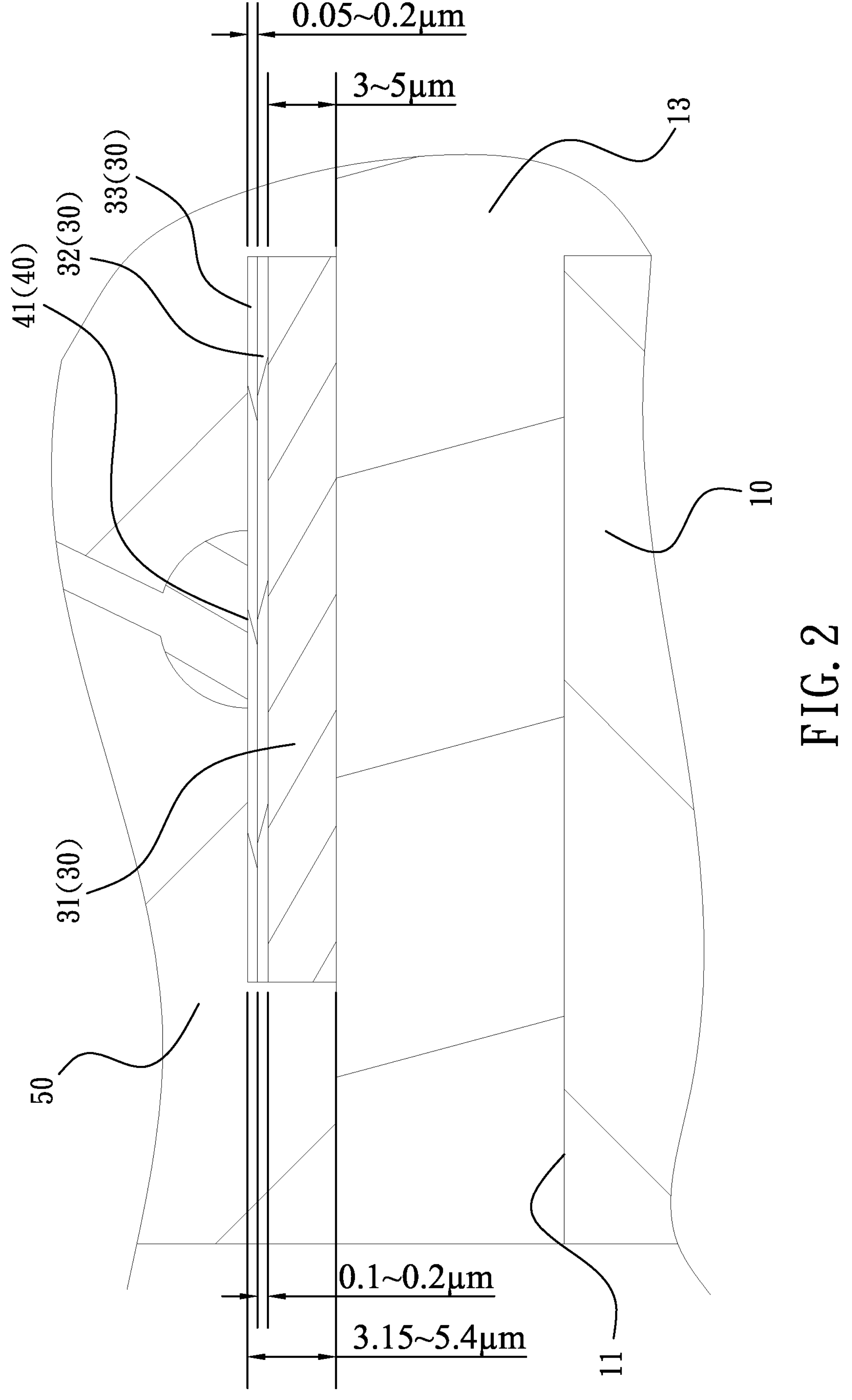
FIG. 2 is a partial enlarged view of the embodiment in FIG. 1 according to the present invention.
Figure 4:
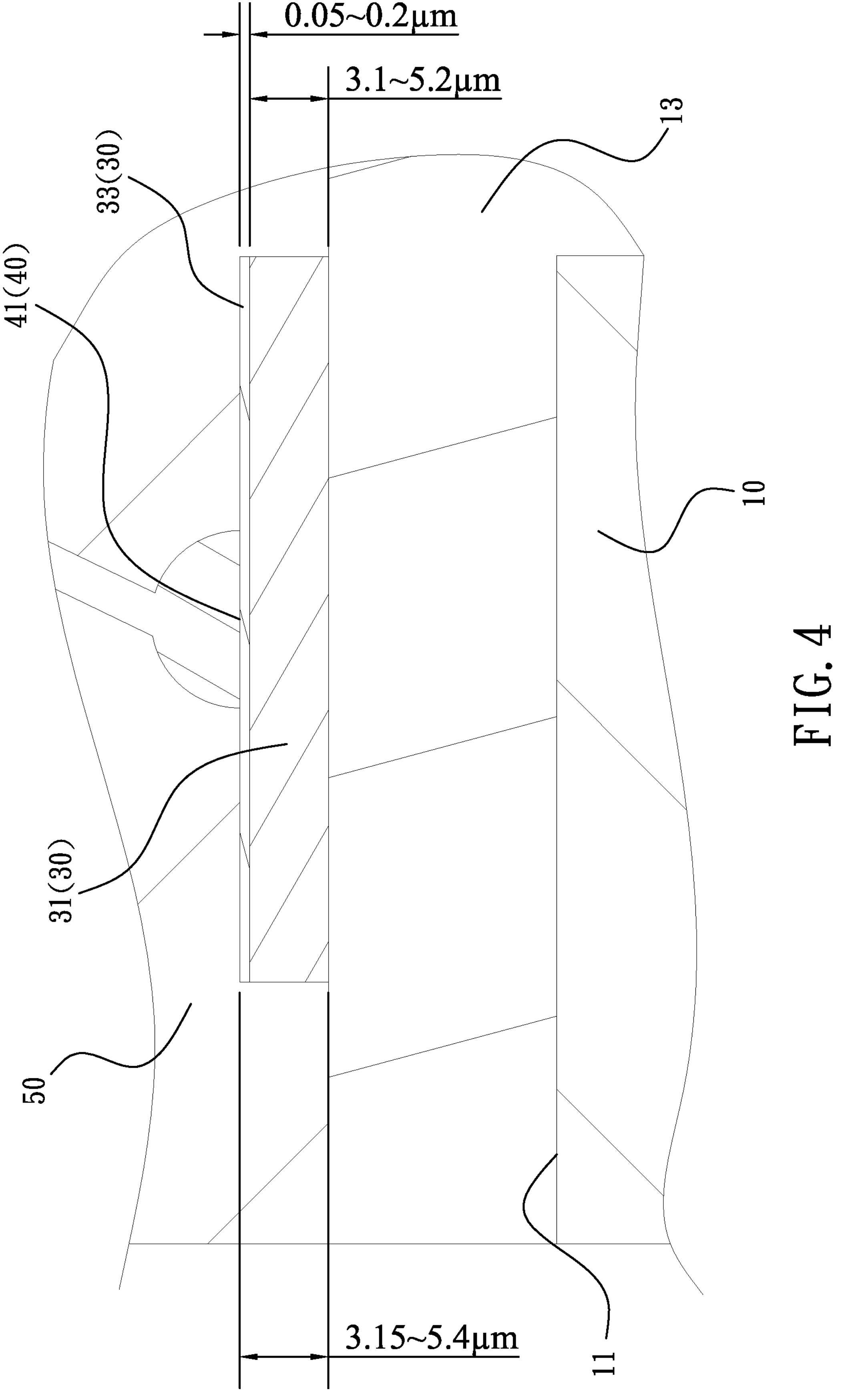
FIG. 4 is a partial enlarged view of the embodiment in FIG. 3 according to the present invention.

The substrate pad 30 which is arranged at the first circuit layer 13 on the first surface 11 of the glass fiber substrate 10 is a stacked metal structure with a certain thickness and composed of a nickel (Ni) layer 31, a palladium (Pd) layer 32, and a gold (Au) layer 33 stacked over the first circuit layer 13 in turn, as shown in FIG. 2. Or as shown in FIG. 4, the substrate pad 30 is a stacked metal structure with a certain thickness and composed of a nickel (Ni) layer 31 and a gold (Au) layer 33 stacked over the first circuit layer 13 in turn. A total thickness of the substrate pad 30 is 3.15-5.4 μm to increase structural strength of the substrate pad 30, as shown in FIG. 2 and FIG. 4.

The bonding wire 40 is generated by wire bonding and provided with two ends respectively being welded to the chip pad 21 of the chip 20 and the substrate pad 30 corresponding to the chip pad 21 to form a solder joint 41 on the chip pad 21 and a solder joint 41 on the substrate pad 30 correspondingly, as shown in FIG. 1 and FIG. 3.

The chip 20 and the first circuit layer 13 on the first surface 11 of the glass fiber substrate 10 are electrically connected with each other by the bonding wire 40, as shown in FIG. 1 and FIG. 3.

The glass fiber insulating layer 50 which is made of FR-4 fiberglass is disposed on the glass fiber substrate 10 by injection molding for covering and sealing the chip 20, the substrate pads 30, and the bonding wires 40, as shown in FIG. 1 and FIG. 3. Still refer to in FIG. 1 and FIG. 3, the glass fiber insulating layer 50 further includes a first surface 51 on which an outer protective layer 60 is disposed for improving structural strength.

When the respective solder joints 41 are formed on the respective substrate pads 30 correspondingly, the glass fiber substrate 10 and the respective substrate pads 30 can withstand positive pressure N generated during wire bonding (direction the arrows N indicate in FIG. 1 and FIG. 3). Thereby the solder joints 41 can be formed on the substrate pads 30 precisely and integrally.

Refer to FIG. 2, the substrate pad 30 is formed by the Ni layer 31, the Pd layer 32, and the Au layer 33 stacked over one another. In 3.15-5.4 μm of the total thickness of the substrate pad 30, a thickness of the Ni layer 31, a thickness of the Pd layer 32, and a thickness of the Au layer 33 are respectively 3-5 μm, 0.1-0.2 μm, and 0.05-0.2 μm. The substrate pad 30 is produced by chemical plating or electroplating technique and able to be used in wire bonding of products with different injection molding parameters.

Refer to FIG. 4, the substrate pad 30 is formed by the Ni layer 31 and the Au layer 33 stacked over each other. In 3.15-5.4 μm of the total thickness of the substrate pad 30, a thickness of the Ni layer 31 is 3.1-5.2 μm and a thickness of the Au layer 33 is 0.05-0.2 μm. The substrate pad 30 produced by chemical plating or electroplating technique can be used in wire bonding of products with different injection molding parameters.

The chip package 1 of the present invention has the following advantages compared with the chip package available now.

(1) The glass fiber substrate 10 of the present invention is made of FR-4 fiberglass and this helps to reduce material cost in manufacturing.

Figure 5:
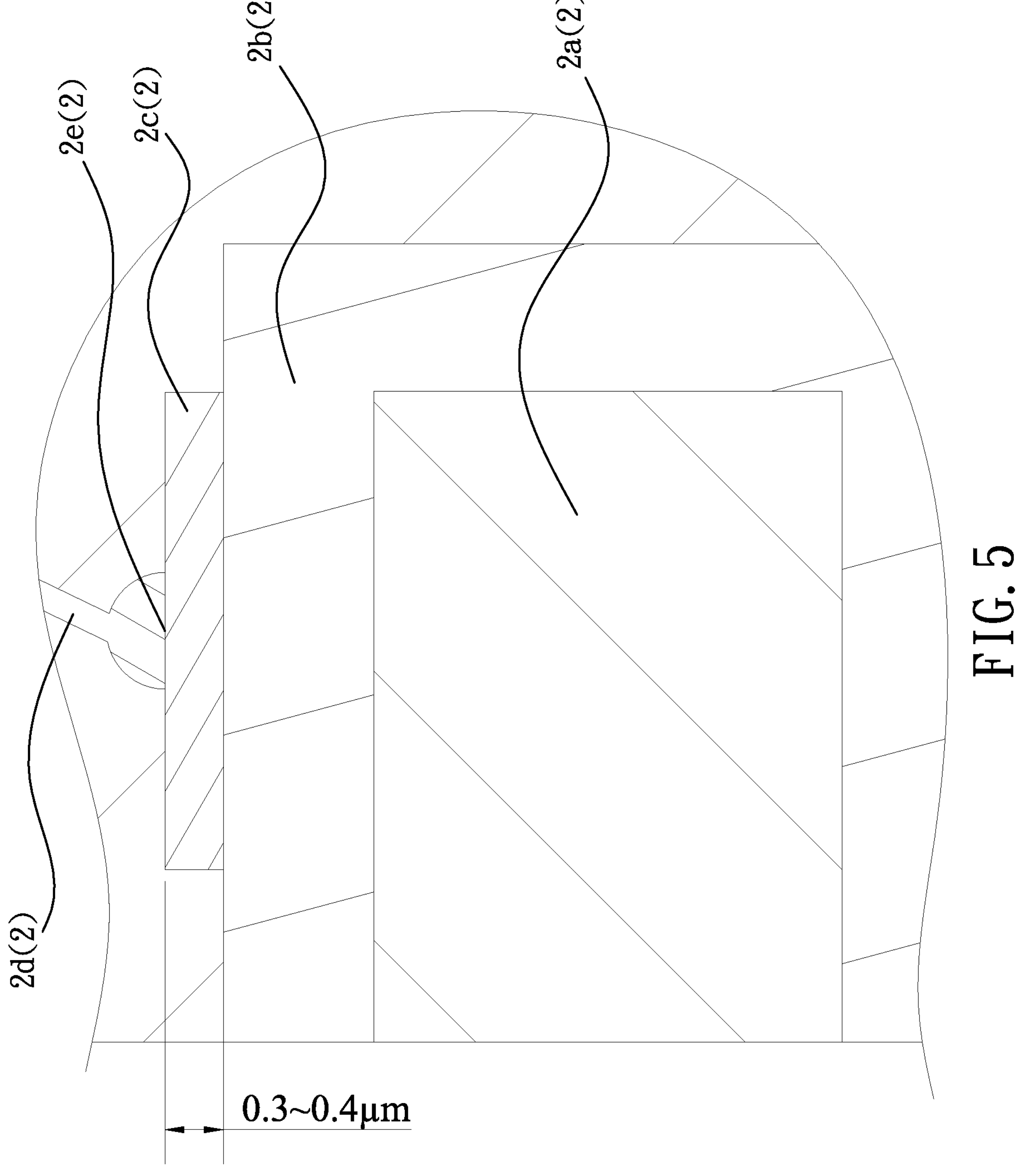
FIG. 5 is a schematic drawing showing structure of a chip package available now.

(2) Compared with the solder pad **2*c* made of only gold (Au) located on the substrate 2*a* and made of BT resin shown in FIG. 5, the present substrate pad 30 is a stacked metal structure with a certain thickness and composed of the Ni layer 31, the Pd layer, and the Au layer 33 stacked over the first circuit layer 13 in turn or only the Ni layer 31 and the Au layer 33 stacked over the first circuit layer 13 in turn, as shown in FIG. 2 and FIG. 4. Moreover, refer to FIG. 2, FIG. 4, and FIG. 5, a thickness of the solder pad 2*c* made of gold (Au) on the BT resin substrate 2*a* is 0.3-0.4 μm (FIG. 5) while a thickness of the gold (Au) layer 33 of the present substrate pad 30 is only 0.05-0.2 μm (FIG. 2 and FIG. 4**). Thereby the problem of higher cost caused by higher ratio of the gold (Au) material in the solder pad on the BT resin substrate available now can be solved and this helps to reduce manufacturing cost.

(3) When the respective solder joints 41 are formed on the respective substrate pads 30 correspondingly, the glass fiber substrate 10 and the respective substrate pads 30 withstand positive pressure N generated during wire bonding (direction the arrows N indicate in FIG. 1 and FIG. 3). Thereby the solder joints 41 can be formed on the substrate pads 30 precisely and integrally. In contrast, once the glass fiber substrate 10 is unable to bear the positive pressure N generated during the wire bonding due to lower material hardness of the glass fiber substrate 10 than the BT resin substrate available now, the solder joints 41 are unable to form on the respective substrate pads 30 integrally. This problem can be solved by the design of the present invention. Thereby product reliability is improved and this helps to improve competitiveness of the product on the market.

(4) The glass fiber insulating layer 50 of the present invention is made of FR-4 fiberglass so that the glass fiber insulating layer 50 is easy to machine and having better mechanical properties, dielectric performance, thermal resistance, and moisture resistance, all help to increase competitiveness of the product on the market.

The invention claimed is:

1. A chip package comprising:

a glass fiber substrate which is made of FR-4 fiberglass and provided with a first surface and a second surface opposite to the first surface; wherein at least one first circuit layer is disposed on the first surface;

wherein at least one second circuit layer is arranged at the second surface of the glass fiber substrate; wherein at least one first blind hole and at least one second blind hole are formed on the first surface of the glass fiber substrate by drilling; wherein the first blind hole and the second blind hole are penetrating the first surface and the glass fiber substrate to be communicating with the second circuit layer; wherein the first circuit layer is extending from the first surface and through an inner surface of both the first blind hole and the second blind hole to be electrically connected with the second circuit layer, at least one chip which is disposed on the first circuit layer on the first surface of the glass fiber substrate and provided with at least one chip pad;

at least one substrate pad which is arranged at the first circuit layer on the first surface of the glass fiber substrate and composed of a nickel (Ni) layer, a palladium (Pd) layer, and a gold (Au) layer stacked over the first circuit layer in turn to form a stacked metal structure with a certain thickness; or the substrate pad is a stacked metal structure with a certain thickness and composed of a nickel (Ni) layer and a gold (Au) layer stacked over the first circuit layer in turn; a total thickness of the substrate pad is 3.15-5.4 μm for increasing structural strength of the substrate pad;

wherein the substrate pad is formed by the Ni layer, the Pd layer, and the Au layer stacked over one another; wherein a thickness of the Ni layer in the substrate pad is 3-5 μm; wherein a thickness of the Pd layer in the substrate pad is 0.1-0.2 μm; wherein a thickness of the Au layer in the substrate pad is 0.05-0.2 μm;

wherein the substrate pad is formed by the Ni layer and the Au layer stacked over each other;

wherein a thickness of the Ni layer in the substrate pad is 3.1-5.2 μm; wherein a thickness of the Au layer in the substrate pad is 0.05-0.2 μm;

at least one bonding wire generated by wire bonding and provided with two ends respectively being welded to the chip pad of the chip and the substrate pad corresponding to the chip pad to form a solder joint on the chip pad and on the substrate pad; and a glass fiber insulating layer made of FR-4 fiberglass and disposed on the glass fiber substrate by injection molding for covering and sealing the chip, the substrate pad, and the bonding wire;

wherein the glass fiber insulating layer further includes a first surface on which an outer protective layer is disposed;

wherein the chip and the first circuit layer on the first surface of the glass fiber substrate 1 are electrically connected with each other by the bonding wire;

wherein the glass fiber substrate and the substrate pad are able to withstand positive pressure generated during wire bonding when the solder joint is formed on the substrate pad correspondingly; thereby the solder joint is formed on the substrate pad precisely and integrally.

2. The chip package as claimed in claim 1, wherein the substrate pad is produced by chemical plating.

3. The chip package as claimed in claim 1, wherein the substrate pad is produced by electroplating.

4. The chip package as claimed in claim 1, wherein the substrate pad is produced by chemical plating.

5. The chip package as claimed in claim 1, wherein the substrate pad is produced by electroplating.

* * * * *